US012801250B2

(12) United States Patent
Lee et al.

(10) Patent No.: US 12,801,250 B2
(45) Date of Patent: Nov. 17, 2026

(54) TOUCH DISPLAY APPARATUS

(71) Applicant: LG Display Co., Ltd., Seoul (KR)

(72) Inventors: Jae Won Lee, Paju-si (KR); Min Joo Kim, Paju-si (KR); Dong Il Chu, Paju-si (KR); Ju Young Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/388,216

(22) Filed: Nov. 13, 2025

(65) Prior Publication Data

US 2026/0186611 A1 Jul. 2, 2026

(30) Foreign Application Priority Data

Dec. 26, 2024 (KR) ........................ 10-2024-0197009

(51) Int. Cl.

| | |
|---|---|
| ***G06F 3/044*** | (2006.01) |
| ***G06F 3/041*** | (2006.01) |
| ***G09G 3/3225*** | (2016.01) |
| ***H10K 59/123*** | (2023.01) |
| ***H10K 59/40*** | (2023.01) |

(52) U.S. Cl.

CPC .......... *G06F 3/0446* (2019.05); *G06F 3/0412* (2013.01); *G09G 3/3225* (2013.01); *H10K 59/123* (2023.02); *H10K 59/40* (2023.02); *G09G 2300/0842* (2013.01)

(58) Field of Classification Search

CPC .. G06F 3/04164; G06F 3/0412; G06F 3/0443; G06F 3/0448; G06F 3/0446; G06F 2203/04111; G06F 2203/04112

See application file for complete search history.

(56) References Cited

U.S. PATENT DOCUMENTS

| | | | | |
|---|---|---|---|---|
| 2021/0026477 A1* | 1/2021 | Lee | ........................ | G06F 3/0412 |
| 2021/0181916 A1* | 6/2021 | Kwon | ................ | G01R 31/2829 |
| 2022/0171498 A1* | 6/2022 | Oh | ........................ | G06F 3/04164 |
| 2023/0214048 A1* | 7/2023 | Kim | .................... | G06F 3/04164 345/174 |

FOREIGN PATENT DOCUMENTS

| | | |
|---|---|---|
| KR | 20210008240 A | 1/2021 |
| KR | 20220073551 A | 6/2022 |

* cited by examiner

*Primary Examiner* — Shaheda A Abdin
(74) *Attorney, Agent, or Firm* — Seed Intellectual Property Law Group LLP

(57) ABSTRACT

A touch display apparatus includes a display panel including an active area, X touch electrode rows extending in a first direction and including X touch electrode rows of a first group and X touch electrode rows of a second group separated from the first group, Y touch electrode columns extending in a second direction, X touch routing lines of a first group provided as a plurality of layers to overlap each other with a plurality of routing insulation layers therebetween in the left bezel area and connected to the X touch electrode rows of the first group, and X touch routing lines of a second group provided as a plurality of layers to overlap each other with a plurality of routing insulation layers therebetween in the right bezel area and connected to the X touch electrode rows of the second group.

19 Claims, 13 Drawing Sheets

TOUCH DISPLAY APPARATUS

CROSS-REFERENCE TO RELATED APPLICATIONS

This application claims the benefit of the Korean Patent Application No. 10-2024-0197009 filed on Dec. 26, 2024, which is hereby incorporated by reference as if fully set forth herein.

BACKGROUND

Technical Field

The present disclosure relates to a touch display apparatus.

Description of the Related Art

To provide various functions to users, display apparatuses provide a function which recognizes a touch based on a pen or a finger of a user contacting a display panel and processes a touch input based on the recognized touch.

Display apparatuses may include a plurality of touch electrodes which are disposed on a display panel or are embedded in the display panel and may detect a variation of a capacitance caused by a touch of a user to sense a touch input applied to the display panel. The touch electrodes may be electrically connected to a touch driving circuit by a touch routing line. The touch driving circuit may supply a touch driving signal to the touch electrode through the touch routing line and may detect a touch sensing signal through the touch routing line.

The touch routing line is disposed in a bezel area of the display panel, which does not display an image,. When a width of the touch routing line is excessively reduced for implementing a narrow bezel, a line resistance increases, and due to this, an RC delay is large.

BRIEF SUMMARY

The present disclosure may provide a touch display apparatus in which a narrow bezel is implemented without a reduction in width of a touch routing line.

As embodied and broadly described herein, a touch display apparatus includes: a display panel including an active area where a plurality of subpixels for image display are arranged, and a left bezel area, a right bezel area, and an upper non-active area outside the active area; a plurality of X touch electrode rows extending in a first direction in an upper portion of the display panel and including X touch electrode rows of a first group and X touch electrode rows of a second group separated from the first group; a plurality of Y touch electrode columns extending in a second direction intersecting the first direction in the upper portion of the display panel; X touch routing lines of a first group provided as a plurality of layers to overlap each other with a plurality of routing insulation layers therebetween in the left bezel area and connected to the X touch electrode rows of the first group; and X touch routing lines of a second group provided as a plurality of layers to overlap each other with a plurality of routing insulation layers therebetween in the right bezel area and connected to the X touch electrode rows of the second group.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
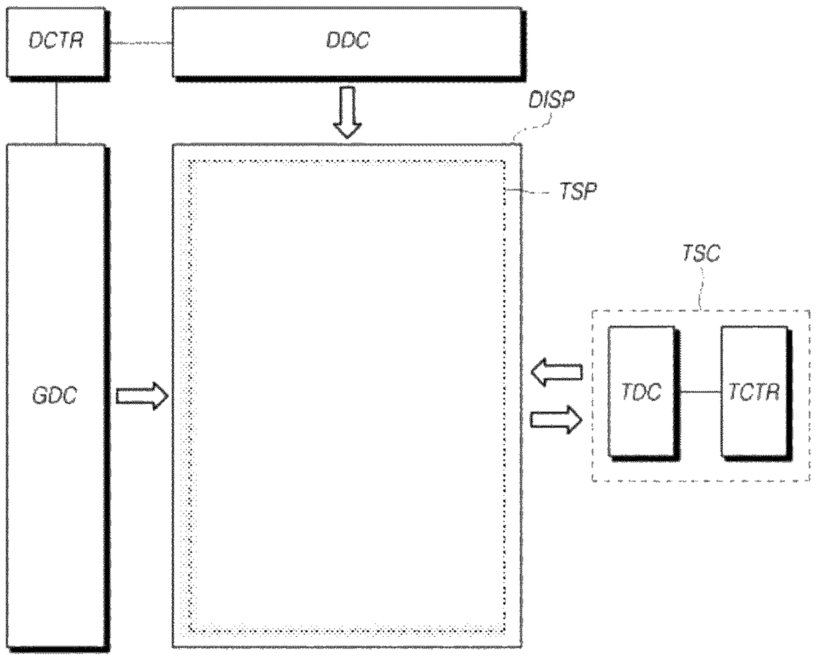
FIG. 1 is a diagram schematically illustrating a touch display apparatus according to an embodiment of the present disclosure.

Hereinafter, the present disclosure will be described more fully with reference to the accompanying drawings, in which exemplary embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The shapes, sizes, ratios, angles, numbers and the like disclosed in the drawings for description of various embodiments of the present disclosure to describe embodiments of the present disclosure are merely exemplary and the present disclosure is not limited thereto. Like reference numerals refer to like elements throughout. Throughout this specification, the same elements are denoted by the same reference numerals. As used herein, the terms “comprise,” “having,” “including” and the like suggest that other parts can be added unless the term “only” is used. As used herein, the singular forms “a,” “an,” and “the” are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on~," "over~," "under~," and "next~," one or more other parts may be disposed between the two parts unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the following description, when the detailed description of the relevant known function or configuration is determined to unnecessarily obscure the important point of the present disclosure, the detailed description will be omitted. Hereinafter, embodiments of the present disclosure will be described in detail with reference to the accompanying drawings.

FIG. 1 is a diagram schematically illustrating a touch display apparatus according to an embodiment of the present disclosure.

Referring to FIG. 1, the touch display apparatus according to an embodiment of the present disclosure may provide a display function and a touch sensing function.

To provide the display function, the touch display apparatus may include a display panel DISP, a data driving circuit DDC which drives a plurality of data lines, a gate driving circuit GDC which drives a plurality of gate lines, and a display controller DCTR which controls an operation of the data driving circuit DDC and an operation of the gate driving circuit GDC.

Each of the data driving circuit DDC, the gate driving circuit GDC, and the display controller DCTR may be implemented as one or more individual elements. Depending on the case, two or more of the data driving circuit DDC, the gate driving circuit GDC, and the display controller DCTR may be integrated and implemented as one element. For example, the data driving circuit DDC and the display controller DCTR may be implemented as one integrated circuit (IC) chip.

To provide the touch sensing function, the touch display apparatus may include a touch panel TSP which includes a plurality of touch electrodes and a touch sensing circuit TSC which supplies a touch driving signal to the touch panel TSP, detects a touch sensing signal from the touch panel TSP, and senses whether there is a touch of a user or a touch position (touch coordinates) in the touch panel TSP, based on the detected touch sensing signal.

The touch sensing circuit TSC may include a touch driving circuit TDC which supplies the touch driving signal to the touch panel TSP and detects the touch sensing signal from the touch panel TSP and a touch controller TCTR which senses whether there is a touch of a user and/or a touch position in the touch panel TSP, based on the touch sensing signal detected by the touch driving circuit TDC.

The touch driving circuit TDC may include a first circuit part which supplies the touch driving signal to the touch panel TSP and a second circuit part which detects the touch sensing signal from the touch panel TSP. The touch driving circuit TDC and the touch controller TCTR may be implemented as separate elements, or depending on the case, may be integrated and implemented as one element.

Furthermore, each of the data driving circuit DDC, the gate driving circuit GDC, and the touch driving circuit TDC may be implemented as one or more ICs, and in terms of an electrical connection with the display panel DISP, may be implemented as a chip on glass (COG) type, a chip on film (COF) type, or a tape carrier package (TCP) type, and the gate driving circuit GDC may be implemented as a gate in panel (GIP) type.

The data driving circuit DDC and the touch driving circuit TDC may be integrated and implemented into one or more IC chips. When the data driving circuit DDC and the touch driving circuit TDC are integrated and implemented into two or more IC chips, each of the two or more IC chips may have a data driving function and a touch driving function.

Moreover, the touch display apparatus according to embodiments of the present disclosure may be various types such as an organic light emitting display apparatus and a liquid crystal display (LCD) apparatus. Hereinafter, for convenience of description, an example where the touch display apparatus is an organic light emitting display apparatus will be described.

The touch panel TSP may include a plurality of touch routing lines for connecting a plurality of touch electrodes to the touch driving circuit TDC. The touch panel TSP may be embedded in the display panel DISP. That is, in a case which manufactures the display panel DISP, a touch sensor structure of a plurality of touch routing lines and a plurality of touch electrodes configuring the touch panel TSP may be formed along with signal lines and electrodes for display driving. Such a touch panel TSP may be an internal type.

Figure 2:
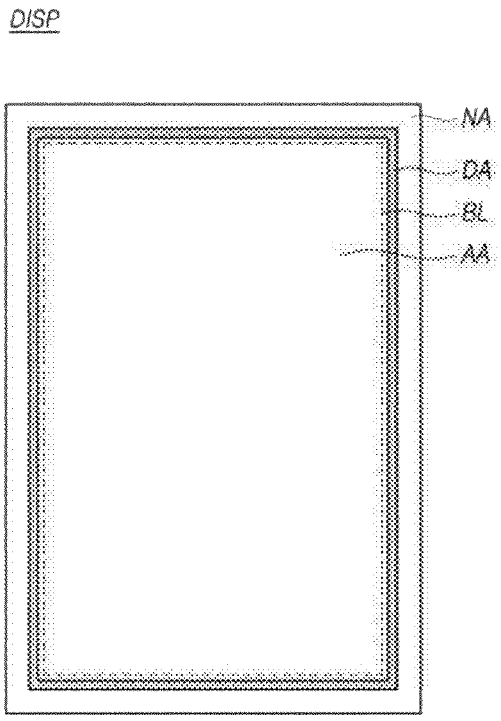
FIG. 2 is a diagram schematically illustrating a display panel of a touch display apparatus according to an embodiment of the present disclosure.

FIG. 2 is a diagram schematically illustrating a display panel DISP of a touch display apparatus according to an embodiment of the present disclosure.

Referring to FIG. 2, the display panel DISP may include an active area AA which displays an image and a non-active area NA which is disposed outside an outer boundary line BL of the active area AA.

In the active area AA of the display panel DISP, a plurality of subpixels for image display may be arranged, and various electrodes or signal lines for display driving may be arranged. In the active area AA, a plurality of touch electrodes for touch sensing may be disposed. Accordingly, the active area AA may be referred to as a touch sensing region capable of touch sensing.

In the non-active area NA of the display panel DISP, link lines to which various signal lines disposed in the active area AA extend or link lines electrically connected to the various signal lines disposed in the active area AA and display pads electrically connected to the link lines may be disposed.

Moreover, in the non-active area NA of the display panel DISP, a plurality of touch routing lines and touch pads electrically connected to the touch routing lines may be disposed. The touch pads may be bonded or electrically connected to the touch driving circuit TDC.

Furthermore, the display panel DISP may further include a dam area DA where a dam DAM for preventing an encapsulation layer of the active area AA from collapsing is disposed. The dam area DA may be disposed at a boundary point between the active area AA and the non-active area NA or one point of the non-active area NA. The dam DAM disposed in the dam area DA may be one pattern where all are connected to each other, or may be configured with two or more patterns disconnected from each other.

Figure 3:
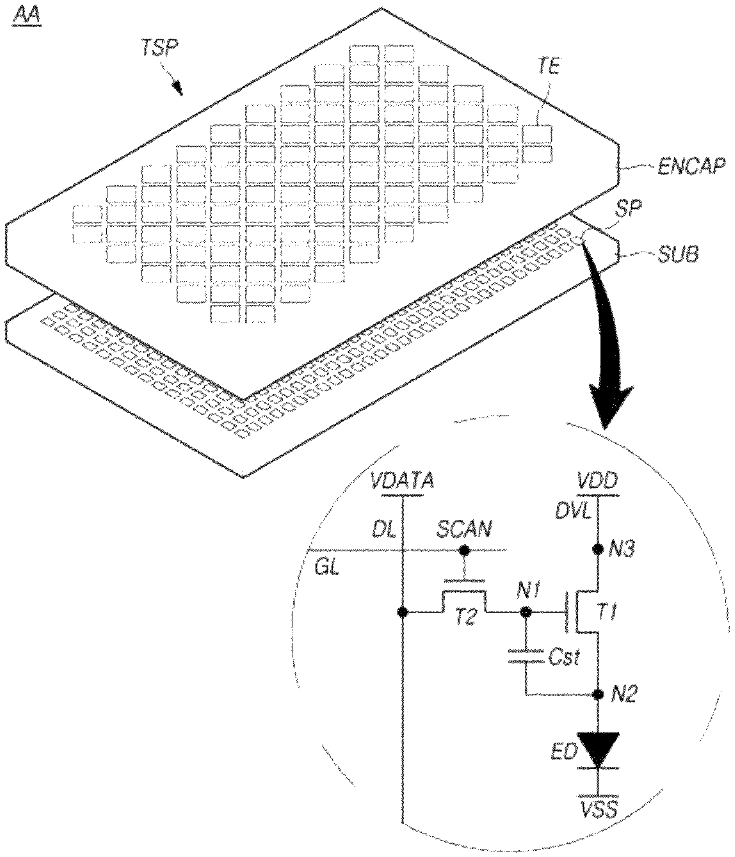
FIG. 3 is a diagram illustrating an example of a structure where a touch panel is embedded in a display panel.

FIG. 3 is a diagram illustrating an example of a structure where a touch panel is embedded in a display panel.

Referring to FIG. 3, in an active area AA of a display panel DISP, a plurality of subpixels SP may be arranged on a substrate SUB.

Each of the plurality of subpixels SP may include a light emitting device ED, a first transistor T1 for driving the light emitting device ED, a second transistor T2 for transferring a data voltage VDATA to a first node N1 of the first transistor T1, and a storage capacitor Cst for holding a certain voltage during one frame.

The first transistor T1 may include the first node N1 to which the data voltage VDATA is applied, a second node N2 electrically connected to the light emitting device ED, and a third node N3 to which a driving voltage VDD is applied through a driving voltage line DVL. The first node N1 may be a gate node, and the second node N2 and the third node N3 may respectively be a source node and a drain node. The first transistor T1 may be a driving transistor which drives the light emitting device ED.

The light emitting device ED may include a first electrode (for example, an anode electrode), an emission layer, and a second electrode (for example, a cathode electrode). The first electrode may be electrically connected to the second node N2 of the first transistor T1, and a ground voltage VSS may be applied to the second electrode. The light emitting device ED may be an organic light emitting diode (OLED) which uses an organic material as an emission layer.

The second transistor T2 may be turned on or off by a scan signal SCAN applied through a gate line GL and may be electrically connected between the first node N1 of the first transistor T1 and a data line DL. The second transistor T2 may be a switching transistor. The second transistor T2 may be turned on by the scan signal SCAN and may transfer the data voltage VDATA, supplied through the data line DL, to the first node N1 of the first transistor T1.

The storage capacitor Cst may be electrically connected between the first node N1 and the second node N2 of the first transistor T1.

The display panel DISP may include an encapsulation layer ENCAP so as to protect a circuit element (particularly, the light emitting device ED) from external water or oxygen. The encapsulation layer ENCAP may be formed of one layer, but may be formed of a plurality of layers.

In the touch display apparatus according to embodiments of the present disclosure, a touch panel TSP may be formed on the encapsulation layer ENCAP. In touch sensing, a touch driving signal or a touch sensing signal may be applied to the touch electrode TE. Therefore, in touch sensing, an electric potential difference may be formed between the touch electrode TE and the cathode electrode which are disposed with the encapsulation layer ENCAP therebetween, and due to this, an undesired parasitic capacitance may be formed. Because such a parasitic capacitance decreases touch sensitivity, a distance between the touch electrode TE and the cathode electrode may be designed to be a certain value (for example, 1 μm) or more based on a panel thickness, a panel manufacturing process, and display performance, so as to decrease a parasitic capacitance. To this end, for example, a thickness of the encapsulation layer ENCAP may be designed to be at least 1 μm or more.

Figure 4:
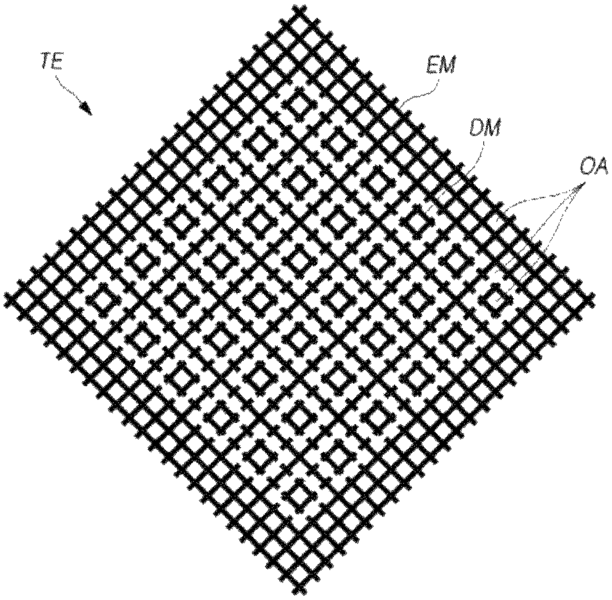
FIG. 4 is a diagram illustrating a touch electrode of mesh type.

FIG. 4 is a diagram illustrating a touch electrode of mesh type.

Referring to FIG. 4, in a region of each touch electrode TE, one or more dummy metals DM disconnected from a mesh-type electrode metal EM may be provided. When one or more dummy metals DM are provided in the region of the touch electrode TE, a visibility issue where a profile of the electrode metal EM is seen on a screen may be prevented.

The electrode metal EM may be a portion corresponding to a real touch electrode TE and may be a portion where a touch driving signal is applied or a touch sensing signal is sensed, and the dummy metal DM may be a portion which is provided in the region of the touch electrode TE and where the touch driving signal is not applied thereto and the touch sensing signal is not sensed. That is, the dummy metal DM may be a metal which is electrically floated. The electrode metal EM may be electrically connected to a touch driving circuit TDC, but the dummy metal DM may not be electrically connected to the touch driving circuit TDC.

In the region of each touch electrode TE, one or more dummy metals DM may be provided with being disconnected from the electrode metal EM. On the other hand, in only a region of each of some touch electrodes TE among all touch electrodes TE, one or more dummy metals DM may also be provided with being disconnected from the electrode metal EM. That is, the dummy metal DM may not be provided in a region of each of some touch electrodes TE.

Figure 5:
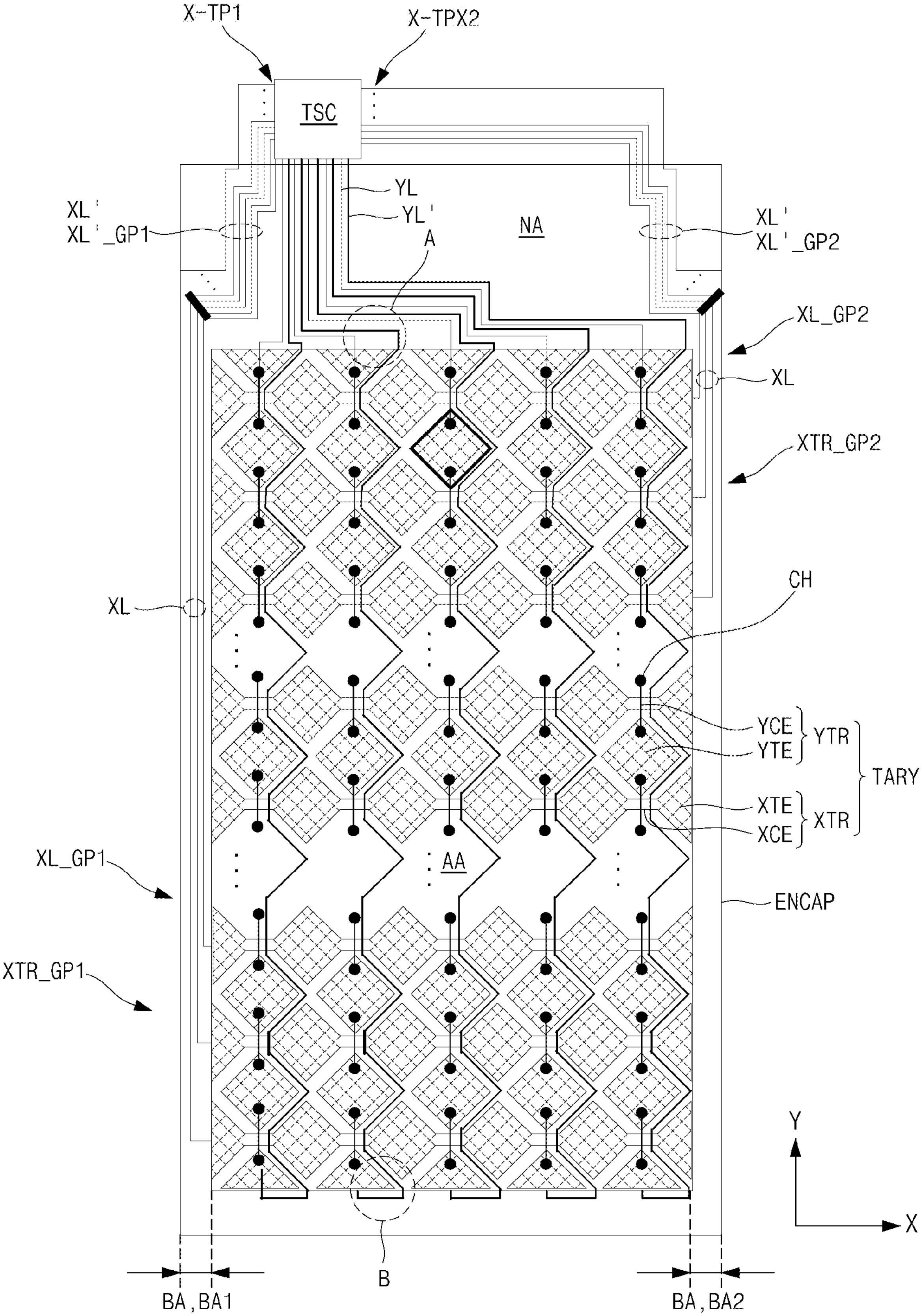
FIG. 5 is a diagram illustrating a mutual capacitance-based touch sensor structure according to an embodiment of the present disclosure.

FIG. 5 is a diagram illustrating a mutual capacitance-based touch sensor structure according to an embodiment of the present disclosure.

Referring to FIG. 5, a touch sensor structure for touch sensing may include a plurality of X touch electrode rows XTR and a plurality of Y touch electrode columns YTR. Here, the plurality of X touch electrode rows XTR and the plurality of Y touch electrode columns YTR may be disposed on an encapsulation layer ENCAP. The encapsulation layer ENCAP may be disposed in an active area AA, and depending on the case, may extend to a non-active area NA.

Each of the plurality of X touch electrode rows XTR may extend in an X-axis direction (or a row direction), and each of the plurality of Y touch electrode columns YTR may extend in a Y-axis direction (or a column direction) intersecting the X direction, thereby configuring a touch sensor array TRAY. The touch sensor array TRAY may be disposed in the active area AA.

In the touch sensor array TRAY, each of the plurality of X touch electrode rows XTR includes a plurality of X touch electrodes XTE which are electrically connected to each other through an X connection electrode XCE, and each of the plurality of Y touch electrode columns YTR includes a plurality of Y touch electrodes YTE which are electrically connected to each other through a Y connection electrode YCE. The X touch electrodes XTE may each be a sensing touch electrode (or a driving touch electrode), and the Y touch electrodes YTE may each be a driving touch electrode (or a sensing touch electrode). The X connection electrode XCE may be a metal which is provided as one body, e.g., integral, with the X touch electrodes XTE. The Y connection electrode YCE may be a bridge metal which connects two adjacent Y touch electrodes YTE with each other through one or more contact holes CH.

A left bezel area BA, BA1, a right bezel area BA, BA2, an upper non-active area NA, and a lower non-active area NA may be disposed outside the active area AA.

The plurality of X touch electrode rows XTR may be divided into a first group XTR_GP1 of X touch electrode rows XTR and a second group XTR_GP2 of X touch electrode rows XTR, which are physically/electrically separated from each other.

The plurality of X touch routing lines XL include a first group XL_GP1 of X touch routing lines XL and a second group XL_GP2 of X touch routing lines XL. X touch routing lines XL of the first group XL_GP1, which are configured as a plurality of layers to overlap each other, may be disposed with a plurality of routing insulation layers MLI (FIG. 6) therebetween in the left bezel area BA1. The X touch routing lines XL of the first group may be individually connected to different X touch electrodes XTE included in the first group XTR_GP1 of X touch electrode rows XTR. The X touch routing lines XL of the first group XL_GP1 may be further connected to X touch link lines XL' of a first group XL'_GP1 through first contact holes CTH1 in the upper non-active area NA. The X touch link lines XL' of the first group XL'_GP1 may be further connected to first X touch pads X-TP1 of a touch sensing circuit TSC in the same single layer (for example, an uppermost layer).

X touch routing lines XL of the second group XL_GP2, which are configured as a plurality of layers to overlap each other, may be disposed with a plurality of routing insulation layers MLI (FIG. 6) therebetween in the right bezel area BA2. The X touch routing lines XL of the second group XL_GP2 may be individually connected to different X touch electrodes XTE included in the X touch electrode rows XTR of the second group XTR_GP2. The X touch routing lines XL of the second group XL_GP2 may be further connected to X touch link lines XL' of a second group XL'_GP2 through second contact holes CTH2 in the upper non-active area NA. The X touch link lines XL' of the second group XL'_GP2 may be further connected to second X touch pads X-TP2 of the touch sensing circuit TSC in the same single layer (for example, an uppermost layer). First Y touch routing lines YL which connect the Y touch pads of the touch sensing circuit TSC to Y touch electrodes YTE of a first row and second Y touch routing lines YL' which connect the Y touch pads of the touch sensing circuit TSC to Y touch electrodes YTE of a last row may be disposed in the upper non-active area NA. The second Y touch routing lines YL' connected to the Y touch pads of the last row may extend from the lower non-active area NA to the upper non-active area NA across the active area AA. In the touch sensor array TRAY, the second Y touch routing lines YL' may be disposed on a layer different from the Y touch electrodes YTE and may extend toward the upper non-active area NA in a winding shape along edge portions of the Y touch electrodes YTE not to overlap the Y touch electrodes YTE. In other words, at least two Y touch routing lines among the Y touch routing lines connected to the plurality of Y touch electrode columns may overlap each other in the upper non-active area NA.

As described above, when the X touch routing lines XL are provided as a plurality of layers to overlap each other in each of the left bezel area BA and the right bezel area BA, and the Y touch routing lines are disposed across the active area AA and overlap each other in the upper non-active area NA, a width of the left bezel area BA and a width of the right bezel area BA may be considerably reduced without a reduction in width of a touch routing line.

Figure 6:
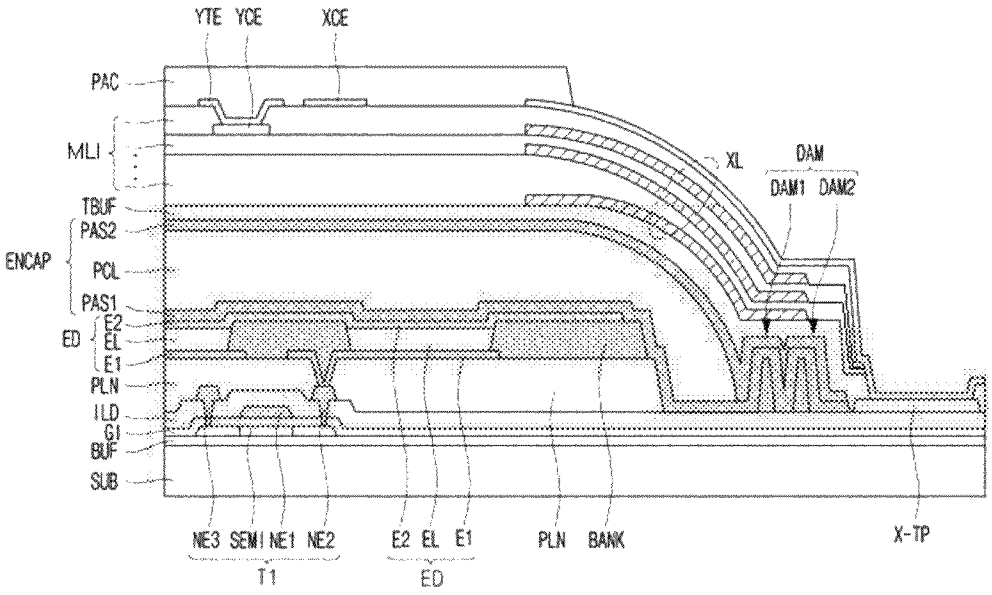
FIG. 6 is a partial cross-sectional view of a display panel with the touch sensor of FIG. 5 embedded therein.

FIG. 6 is a partial cross-sectional view of a display panel with the touch sensor of FIG. 5 embedded therein.

Referring to FIG. 6, a first transistor T1 which is a driving transistor of each subpixel SP in an active area AA may be disposed on a substrate SUB.

The first transistor T1 may include a first node electrode NE1 corresponding to a gate electrode, a second node electrode NE2 corresponding to a source electrode or a drain electrode, a third electrode NE3 corresponding to the drain electrode or the source electrode, and a semiconductor layer SEMI. The first node electrode NE1 and the semiconductor layer SEMI may overlap each other with a gate insulation layer GI therebetween. The second node electrode NE2 may be formed on an insulation layer ILD and may connect one side of the semiconductor layer SEMI, and the third node electrode NE3 may be formed on the insulation layer ILD and may connect the other side of the semiconductor layer SEMI.

A light emitting device ED may include a first electrode E1 corresponding to an anode electrode, an emission layer EL formed on the first electrode E1, and a second electrode E2 corresponding to a cathode electrode formed on the emission layer EL. The first electrode E1 may be electrically connected to the second node electrode NE2 of the first transistor T1 exposed through a pixel contact hole passing through a planarization layer PNL. The emission layer EL may be formed on a first electrode E1 of an emission region provided by a bank BANK. The emission layer EL may be formed by stacking a hole-related layer, an emission layer, and an electron-related layer on the first electrode E1 in order or reverse order. The second electrode E2 may be formed to face the first electrode E1 with the emission layer EL therebetween.

An encapsulation layer ENCAP may prevent external water or oxygen from penetrating into the light emitting device ED vulnerable to external water or oxygen. The encapsulation layer ENCAP may be configured in a structure where a first inorganic encapsulation layer PAS1, an organic encapsulation layer PCL, and a second inorganic encapsulation layer PAS2 are stacked in order. When the organic encapsulation layer PCL is formed through an inkjet process, one or more dams DAM may be formed in a dam area DAM corresponding to a partial region of a non-active area NA or a boundary region between the non-active area NA and the active area AA.

The dam area may be disposed between the active area AA and a pad area where X/Y touch pads are formed in the non-active area NA. A primary dam DAM1 adjacent to the active area AA and a secondary dam DAM2 adjacent to the pad area may be formed in the dam area. The first inorganic encapsulation layer PAS1 and the second inorganic encapsulation layer PAS2 may be disposed to extend to the primary dam DAM1 and the secondary dam DAM2.

A touch buffer layer TBUF may be disposed on the encapsulation layer ENCAP, and a plurality of routing insulation layers MLI may be disposed on the touch buffer layer TBUF.

The touch buffer layer TBUF may prevent external water or a chemical solution (developer, etchant, or the like), used in a manufacturing process of a touch sensor array TRAY disposed on the touch buffer layer TBUF, from penetrating into the emission layer EL. Accordingly, the touch buffer layer TBUF may prevent the damage of the emission layer EL vulnerable to a chemical solution or water.

A plurality of routing insulation layers MLI may electrically separate X touch routing lines which are provided as a plurality of layers and overlap each other, in a left or right bezel area. The plurality of routing insulation layers MLI may include an inorganic insulation layer robust to the penetration of water. Also, the plurality of routing insulation layers MLI may include an organic insulation layer which is good in flatness. In this case, the organic insulation layer may further include a silica bead, and thus, a water transmission prevention function of the routing insulation layer may be enhanced.

Based on the plurality of routing insulation layers MLI, a separation distance between the touch sensor array TRAY and the second electrode E2 of the light emitting device ED may increase. A parasitic capacitance between the touch sensor array TRAY and the second electrode E2 of the light emitting device ED may decrease, and thus, a reduction in touch sensitivity caused by the parasitic capacitance may be prevented. Such an improvement effect may further increase when the routing insulation layers MLI include the organic insulation layer.

A mutual capacitance-based touch sensor array TRAY may be disposed on the plurality of routing insulation layers MLI. Each of a plurality of X touch electrode rows extending in a first direction may be configured with a plurality of X touch electrodes XTE which are electrically connected to each other through an X connection electrode XCE, and each of a plurality of Y touch electrode columns extending in a second direction may be configured with a plurality of Y touch electrodes YTE which are electrically connected to each other through a Y connection electrode YCE. The X connection electrode XCE may be disposed on the same layer as the X touch electrodes XTE and the Y touch electrodes YTE, and the Y connection electrode YCE may be disposed on a layer different from the X touch electrodes XTE and the Y touch electrodes YTE.

The touch sensor array TRAY may be disposed to overlap the bank BANK, and thus, may prevent an aperture ratio from being reduced by the touch sensor array TRAY. The touch sensor array TRAY may be covered by a passivation layer PAC.

X touch routing lines XL connected to the plurality of X touch electrode rows XTR may be stacked over one another with the plurality of routing insulation layers MLI therebetween. For example, a routing insulation layer MLI is positioned between and separates two vertically adjacent X touch routing lines XL. The X touch routing lines XL may be connected to X touch pads X-TP of a touch sensing circuit via X touch link lines XL'. Furthermore, the Y touch routing lines YL may be connected to Y touch pads of the touch sensing circuit via Y touch link lines.

Figure 7:
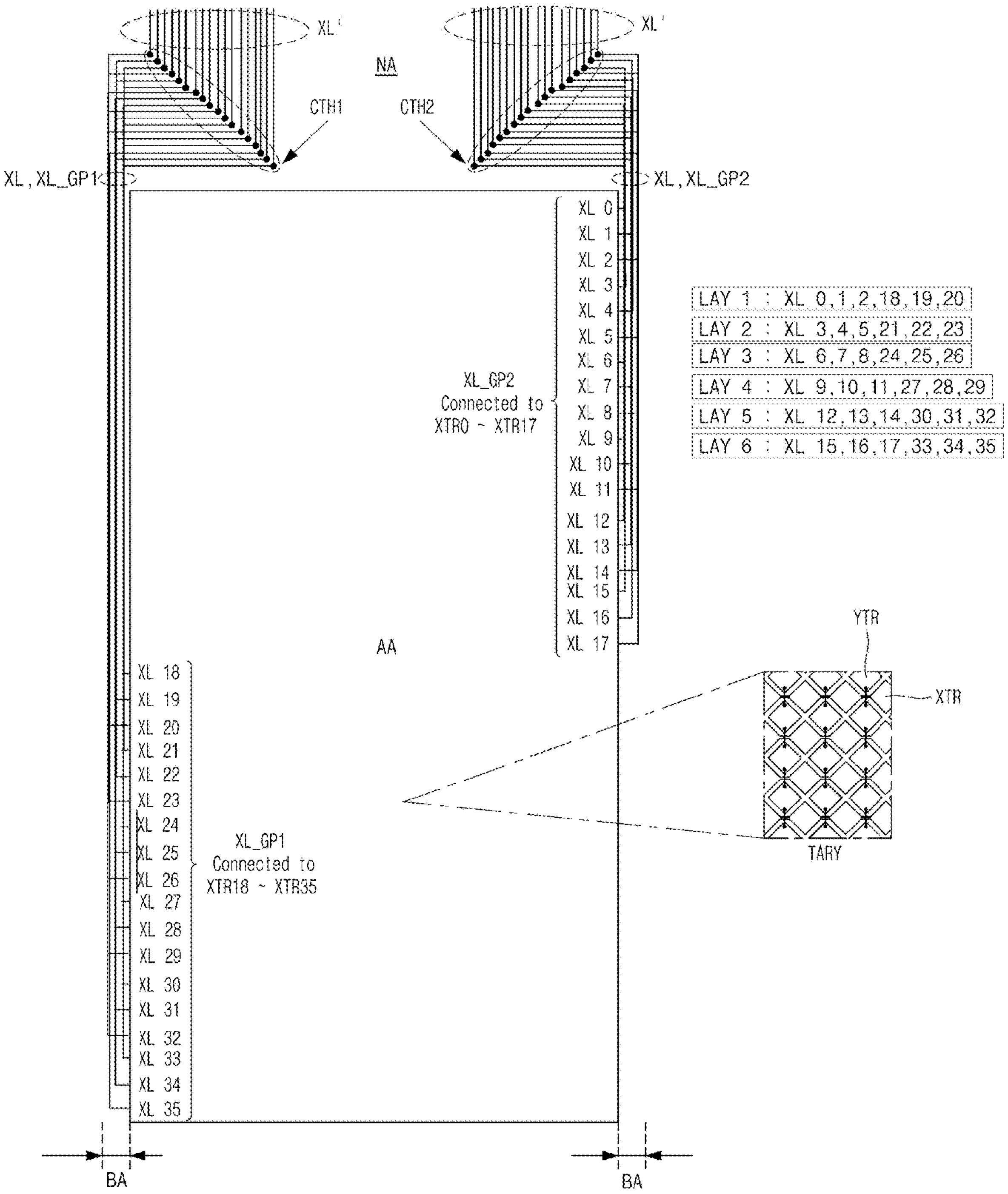
FIG. 7 is a diagram illustrating an arrangement example of X touch routing lines of a first group and X touch routing lines of a second group.
Figure 8:
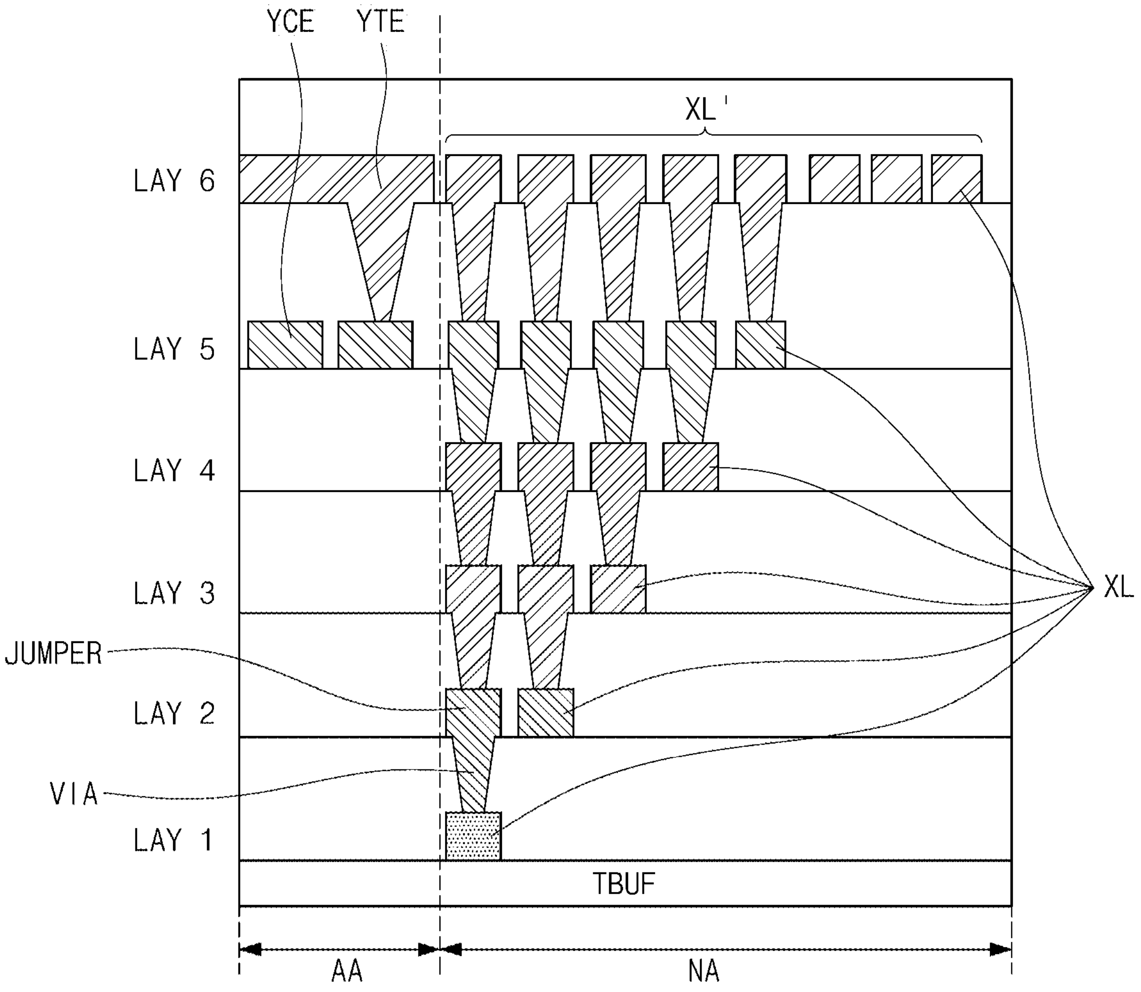
FIGS. 8 and 9A to 9C are diagrams illustrating an example where X touch routing lines are divided through a plurality of layers.
Figure 9A:
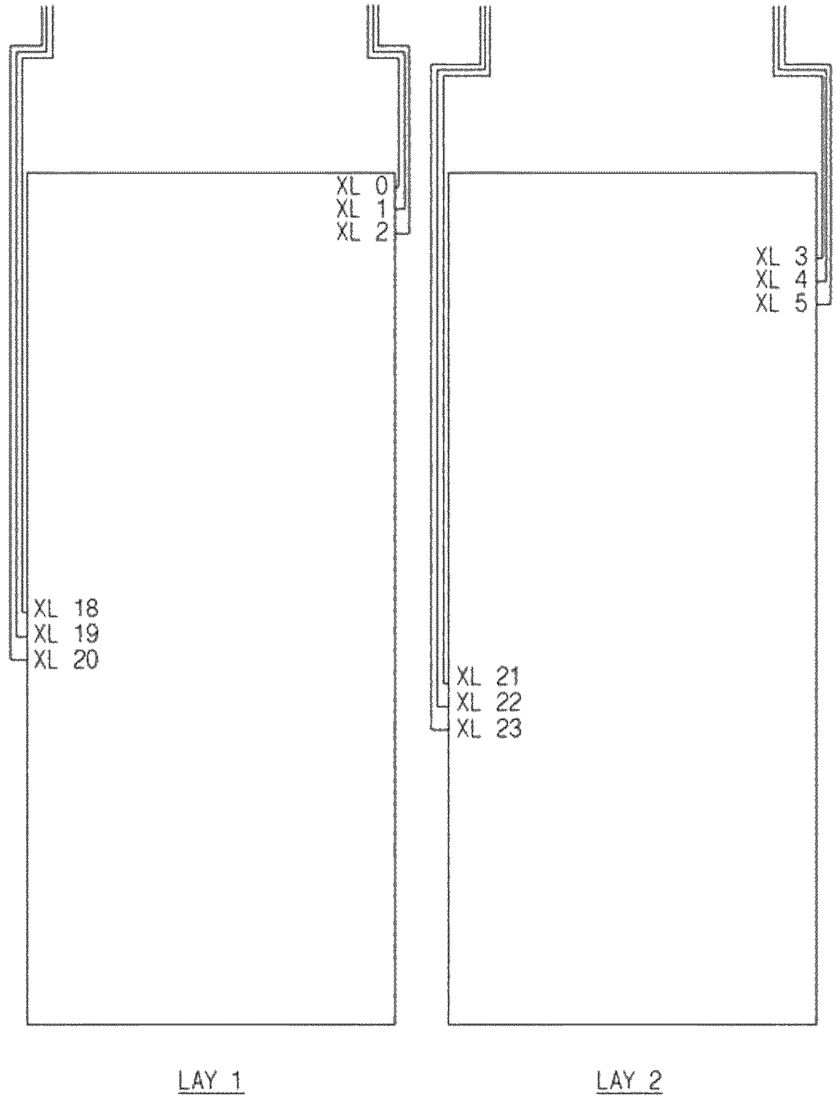
Figure 9B:
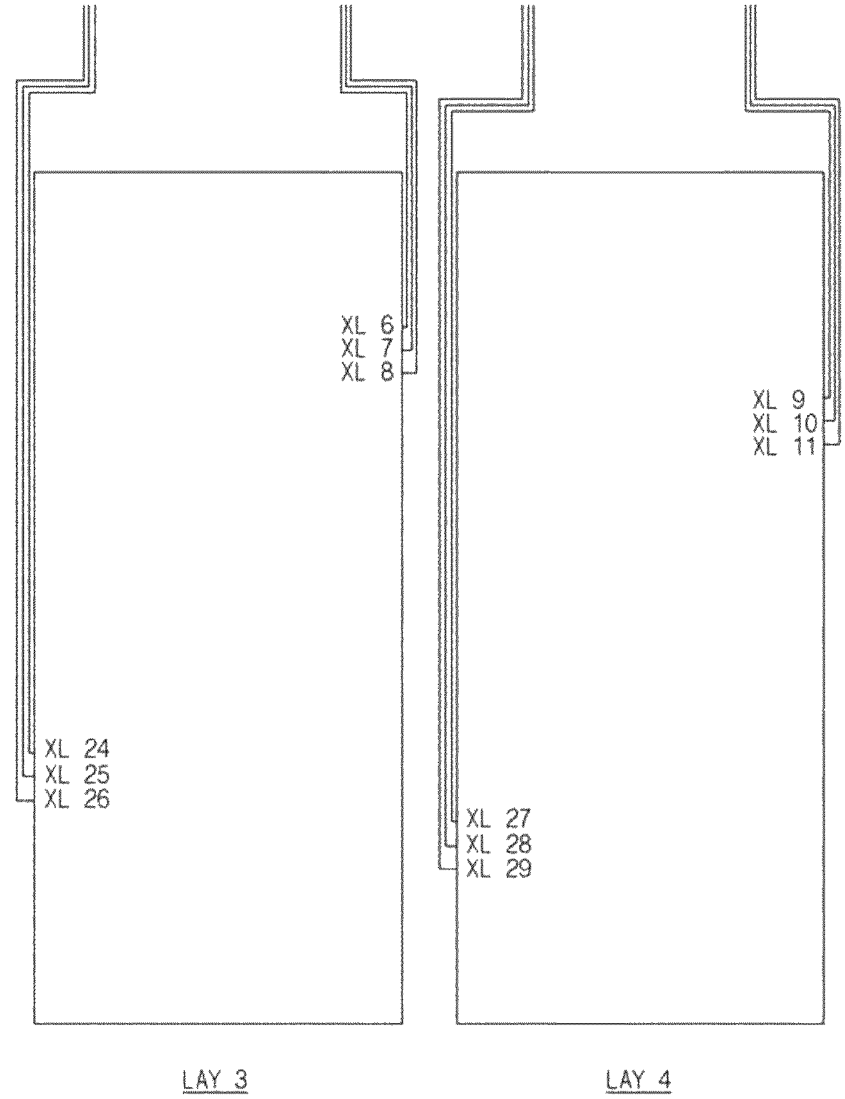
Figure 9C:
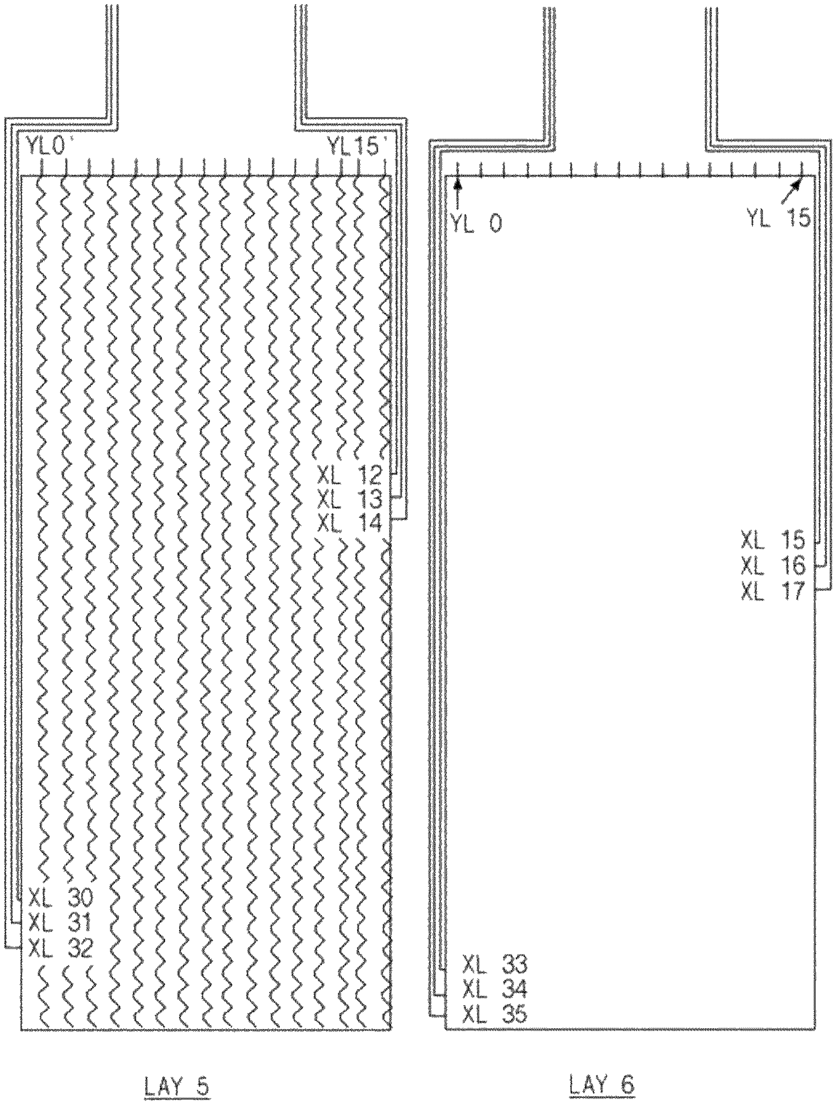

FIG. 7 is a diagram illustrating an arrangement example of X touch routing lines of a first group and X touch routing lines of a second group. FIGS. 8 and 9A to 9C are diagrams illustrating an example where X touch routing lines are divided through a plurality of layers. FIG. 8 shows that an X touch routing line XL on a layer (LAY 1, LAY 2, LAY 3, LAY 4, LAY 5) may be connected to an X touch link line XL' on a different layer (LAY 6) through one or more interconnect structures, e.g., a via structure VIA and a jumper structure JUMPER.

Referring to FIGS. 7 to 9C, when the number of X touch electrode rows configuring a touch sensor array TRAY is, for example 36, the X touch electrode rows may be configured with XTR0 to XTR35. In this case, the X touch electrode rows may be divided into X touch electrode rows XTR18 to XTR35 of a first group and X touch electrode rows XTR0 to XTR17 of a second group.

X touch routing lines XL_GP1 of a first group connected to the X touch electrode rows XTR18 to XTR35 of the first group may be XL18 to XL35, and X touch routing lines XL_GP2 of a second group connected to the X touch electrode rows XTR0 to XTR17 of the second group may be XL0 to XL17.

In a left bezel area BA, the X touch routing lines XL_GP1 of the first group may be disposed apart from each other with units of K (where K may be a natural number of 2 or more) number in each of a plurality of layers, and the number of layers may be J (where J may be a natural number of K or more). In a right bezel area BA, the X touch routing lines XL_GP2 of the second group may be disposed apart from each other with units of K number in each of a plurality of layers, and the number of layers may be J.

For example, in the left bezel area BA, the X touch routing lines XL of the first group XL_GP1 may be disposed apart from one another with three units in each of six layers LAY1 to LAY6, and in the right bezel area BA, the X touch routing lines XL of the second group XL_GP2 may be disposed apart from one another with three units in each of the six layers LAY1 to LAY6.

In other words, in the left bezel area BA, at least three of the X touch routing lines XL of the first group XL_GP1 may overlap one another, and in the right bezel area BA, at least three of the X touch routing lines XL of the second group XL_GP2 may overlap one another.

XL 18, 19, and 20 may be disposed apart from one another in a first layer LAY1 of the left bezel area BA, and XL 0, 1, and 2 may be disposed apart from one another in a first layer LAY1 of the right bezel area BA. XL 21, 22, and 23 may be disposed apart from one another in a second layer LAY2 of the left bezel area BA, and XL 3, 4, and 5 may be disposed apart from one another in a second layer LAY2 of the right bezel area BA. XL 24, 25, and 26 may be disposed apart from one another in a third layer LAY3 of the left bezel area BA, and XL 6, 7, and 8 may be disposed apart from one another in a third layer LAY3 of the right bezel area BA.

XL 27, 28, and 29 may be disposed apart from one another in a fourth layer LAY4 of the left bezel area BA, and XL 9, 10, and 11 may be disposed apart from one another in a fourth layer LAY4 of the right bezel area BA. XL 30, 31, and 32 may be disposed apart from one another in a fifth layer LAY5 of the left bezel area BA, and XL 12, 13, and 14 may be disposed apart from one another in a fifth layer LAY5 of the right bezel area BA. XL 33, 34, and 35 may be disposed apart from one another in a sixth layer LAY6 of the left bezel area BA, and XL 15, 16, and 17 may be disposed apart from one another in a sixth layer LAY6 of the right bezel area BA.

Totally eighteen X touch routing lines XL of the first group XL_GP1, which are stacked as six layers with three units on each of the six layers in the left bezel area BA1, may be connected to eighteen X touch link lines XL' of first group XL'_GP1 through first contact holes CTH1 in an upper non-active area NA.

Totally eighteen X touch routing lines XL of the second group XL_GP2, which are stacked as six layers with three units on each of the six layers in the right bezel area BA2 may be connected to eighteen X touch link lines XL' of the second group XL'_GP2 through second contact holes CTH2 in the upper non-active area NA.

Figure 10:
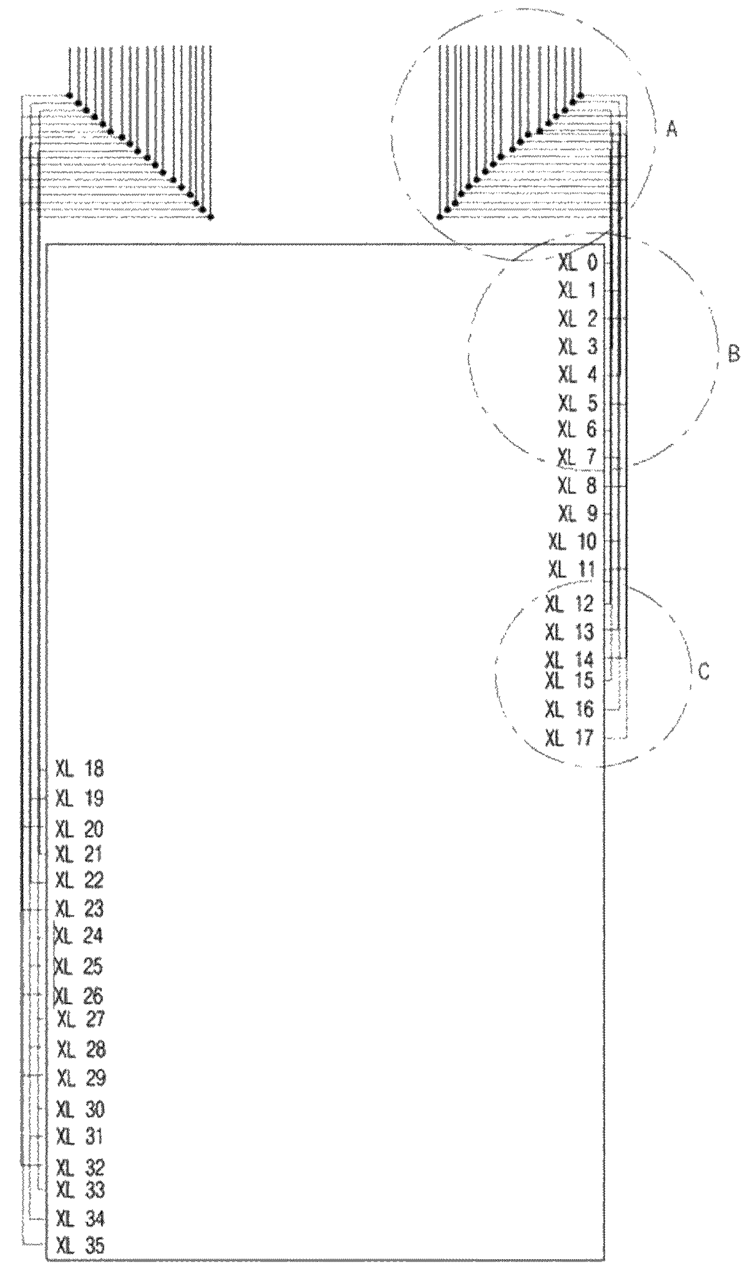
FIGS. 10 to 12 are diagrams illustrating a partial contact structure of X touch routing lines XL_GP2 of a second group.
Figure 11:
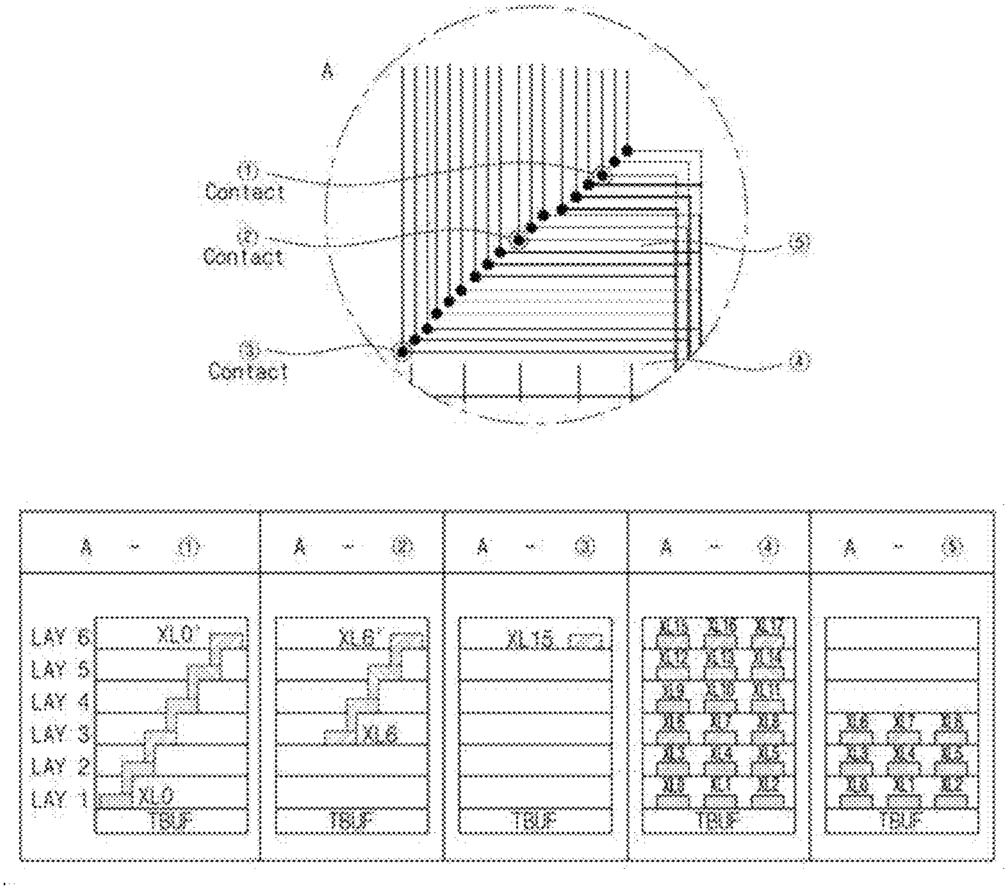
Figure 12:
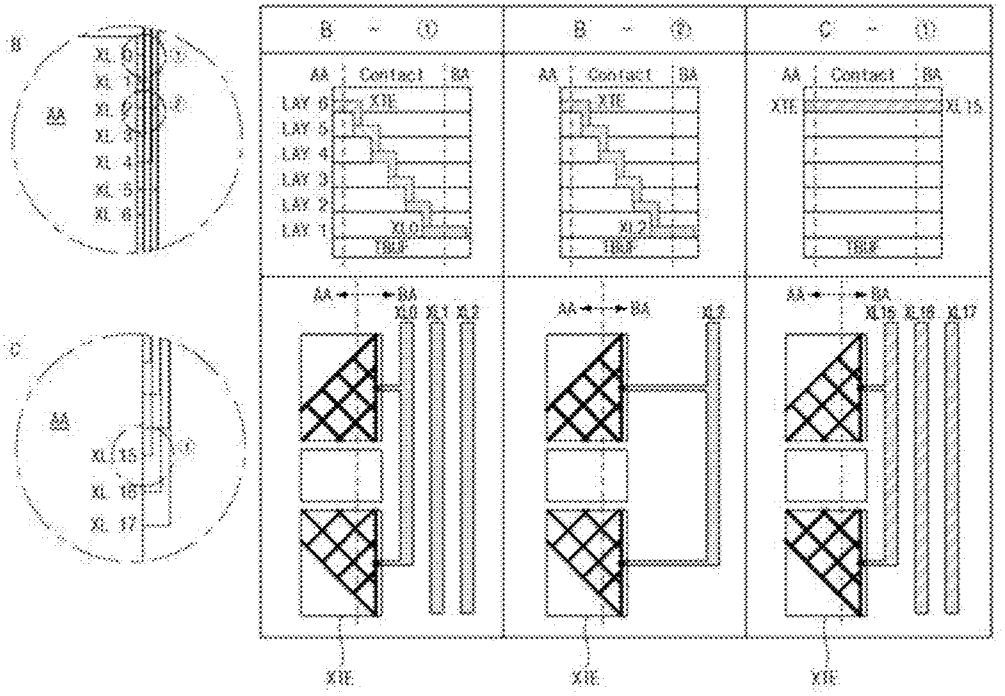

FIGS. 10 to 12 are diagrams illustrating a partial contact structure of X touch routing lines XL_GP2 of a second group.

Referring to FIGS. 10 and 11, as in ① of a region A, XL0 of a first layer LAY1 in an upper non-active area NA may pass through, e.g., through interconnect structures VIA/JUMPER, second to fifth layers LAY2 to LAY5 and may be connected to XL0' of a sixth layer LAY6. As in ② of the region A, XL6 of a third layer LAY3 in the upper non-active area NA may pass through, e.g., through interconnect structures VIA/JUMPER, the fourth layer LAY4 and the fifth layer LAY5 and may be connected to XL6' of the sixth layer LAY6. As in ③ of the region A, XL15 of the sixth layer LAY6 in the upper non-active area NA may be connected to XL15' of the sixth layer LAY6. As in ④ of the region A, a total of 18 X touch routing lines of the second group XL_GP 2, which are stacked with three units in each of the first to sixth layers LAY1 to LAY6 may be disposed in an upper non-active area NA relatively close to an active area. As in ⑤ of the region A, a total of 9 X touch routing lines of the second group XL_GP2, which are stacked with three units in each of the first to third layers LAY1 to LAY3, may be disposed in an upper non-active area NA relatively far away from the active area.

Referring to FIGS. 10 and 12, as in ① of a region B, XL0 of a first layer LAY1 may pass through second to fifth layers LAY2 to LAY5 and may be connected to an X touch electrode XTE of a sixth layer LAY6, in a boundary region between a right bezel area BA and an active area AA. As in ② of the region B, XL2 of the first layer LAY1 may pass through the second to fifth layers LAY2 to LAY5 and may be connected to the X touch electrode XTE of the sixth layer LAY6, in the boundary region between the right bezel area BA and the active area AA. As in ① of a region C, XL15 of the sixth layer LAY6 may be connected to the X touch electrode XTE of the sixth layer LAY6, in the boundary region between the right bezel area BA and the active area AA.

Figure 13:
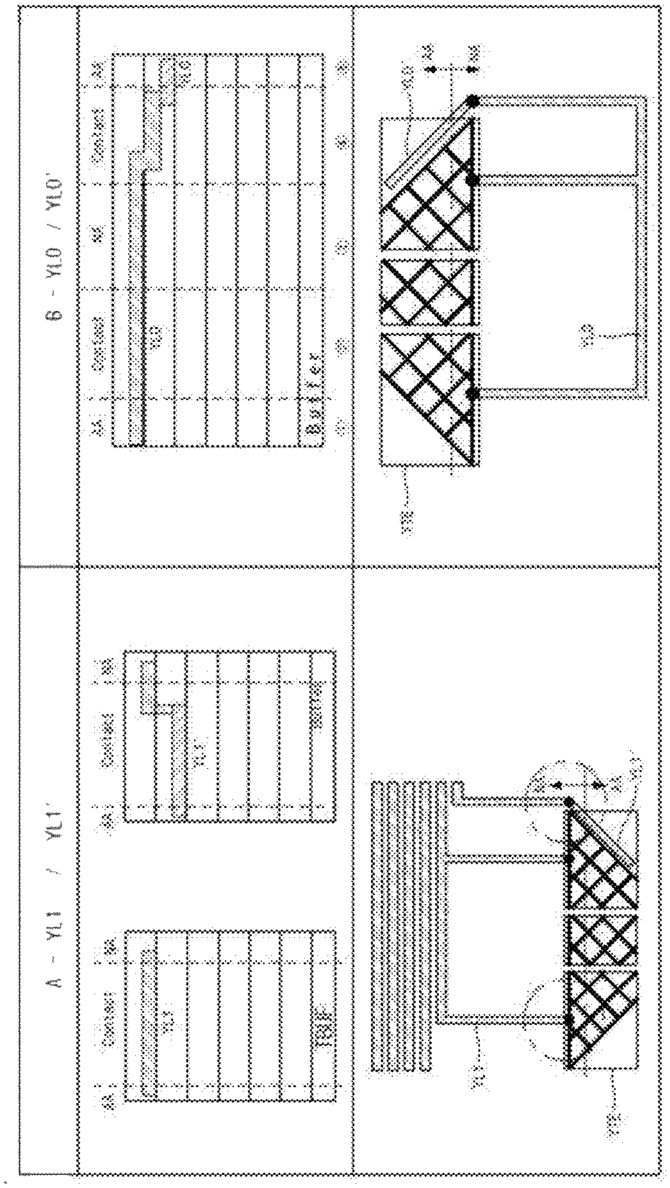
FIG. 13 is a diagram illustrating a contact structure of regions A and B of FIG. 10.

FIG. 13 is a diagram illustrating a contact structure of regions A and B of FIG. 10.

Referring to FIG. 13, in a sixth layer of a region A, a first Y touch routing line YL1 may be connected to a Y touch electrode YTE of a first row. A second Y touch routing line YL1' may extend across an active area AA toward a lower non-active area NA in a fifth layer under a sixth layer. The second Y touch routing line YL1' may be connected to a Y touch electrode YTE of a last row in a sixth layer of the lower non-active area NA.

In a sixth layer of a region B, a second Y touch routing line YL0' may be connected to a Y touch electrode YTE of a last row. The second Y touch routing line YL0' may extend across the active area AA toward an upper non-active area NA in the fifth layer under the sixth layer.

The embodiments of the present disclosure may realize the following effect.

In the touch display apparatus according to the embodiments of the present disclosure, X touch routing lines may be disposed as a plurality of layers to overlap each other in each of a left bezel area BA and a right bezel area BA, and Y touch routing lines may be disposed across an active area. Accordingly, a width of the left bezel area BA and a width of the right bezel area BA may be considerably reduced without a reduction in width of a touch routing line.

The effects according to the present disclosure are not limited to the above examples, and other various effects may be included in the specification.

While the present disclosure has been particularly shown and described with reference to exemplary embodiments thereof, it will be understood by those of ordinary skill in the art that various changes in form and details may be made therein without departing from the spirit and scope of the present disclosure including the following claims.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display apparatus comprising: a display panel including an active area where a plurality of subpixels for image display are arranged, and a left bezel area, a right bezel area, and an upper non-active area outside the active area; a plurality of X touch electrode rows extending in a first direction in an upper portion of the display panel and including a first group of X touch electrode rows and a second group of X touch electrode rows separated from the first group of X touch electrode rows; a plurality of Y touch electrode columns extending in a second direction intersecting the first direction in the upper portion of the display panel; a first group of X touch routing lines on a plurality of layers that overlap each other with a plurality of routing insulation layers therebetween in the left bezel area and connected to the X touch electrode rows of the first group of touch electrode rows; and a second group of touch routing lines on a plurality of layers that overlap each other with a plurality of routing insulation layers therebetween in the right bezel area and connected to the X touch electrode rows of the second group of touch electrode rows; wherein the X touch routing lines of the first group of X touch routing lines are further connected to X touch link lines of a first group of X touch link lines through first contact holes in the upper non-active area, wherein the X touch routing lines of the second group of X touch routing lines are further connected to X touch link lines of a second group of X touch link lines through second contact holes in the upper non-active area, wherein the X touch link lines of the first group of X touch link lines are connected to first X touch pads of a touch sensing circuit on a same single layer, and wherein the X touch link lines of the second group of X touch link lines are connected to second X touch pads of the touch sensing circuit on a same single layer.

2. The touch display apparatus of claim 1, wherein each of the plurality of X touch electrode rows includes a plurality of X touch electrodes electrically connected to each other through an X connection electrode, wherein the X touch routing lines of the first group of X touch routing lines in the left bezel area are individually connected to different X touch electrodes included in the X touch electrode rows of the first group of X touch electrode rows, and wherein the X touch routing lines of the second group of X touch routing lines in the right bezel area are individually connected to different X touch electrodes included in the X touch electrode rows of the second group of X touch electrode rows.

3. The touch display apparatus of claim 1, wherein each of the plurality of Y touch electrode columns includes a plurality of Y touch electrodes electrically connected to each other through a Y connection electrode, wherein first Y touch routing lines connecting Y touch pads of a touch sensing circuit to Y touch electrodes of a first row and second Y touch routing lines connecting Y touch pads of the touch sensing circuit to Y touch electrodes of a last row are disposed in the upper non-active area, and wherein the second Y touch routing lines extend to the upper non-active area across the active area.

4. The touch display apparatus of claim 3, wherein the second Y touch routing lines are disposed on a layer different from the plurality of Y touch electrodes and extend toward the upper non-active area in a winding shape along edge portions of the plurality of Y touch electrodes not to overlap the plurality of Y touch electrodes.

5. The touch display apparatus of claim 1, wherein each of the routing insulation layers is an inorganic insulation layer or an organic insulation layer.

6. The touch display apparatus of claim 5, wherein the organic insulation layer includes a silica bead.

7. The touch display apparatus of claim 1, wherein, in the left bezel area, the X touch routing lines of the first group of X touch routing lines are disposed apart from each other with K number of X touch routing lines on each of the plurality of layers, and a number of the plurality of layers is J, K being a natural number of 2 or more and J being a natural number of K or more.

8. The touch display apparatus of claim 1, wherein, in the right bezel area, the X touch routing lines of the second group of X touch routing lines are disposed apart from each other with K number of X touch routing lines on each of the plurality of layers, and a number of the plurality of layers is J, K being a natural number of 2 or more and J being a natural number of K or more.

9. The touch display apparatus of claim 1, wherein at least three X touch routing lines among the X touch routing lines of the first group of X touch routing lines overlap one another in the left bezel area, and wherein at least three X touch routing lines among the X touch routing lines of the second group of X touch routing lines overlap one another in the right bezel area.

10. The touch display apparatus of claim 1, wherein at least two Y touch routing lines among Y touch routing lines connected to the plurality of Y touch electrode columns overlap each other in the upper non-active area.

11. A touch display apparatus comprising: a display panel including an active area having a plurality of subpixels, and a non-active area outside the active area; a plurality of X touch electrode rows extending in a first direction the active area, the plurality of X touch electrode including a first group of X touch electrode rows; a first group of X touch routing lines connected to the first group of touch electrode rows, the first group of X touch routing lines being positioned on a plurality of stacked layers; and a plurality of routing insulation layers each positioned vertically between two adjacent stacked layers of the plurality of stacked layers; wherein the X touch routing lines of the first group of X touch routing lines are further connected to X touch link lines of a first group of X touch link lines through first contact holes in the upper non-active area, wherein the X touch routing lines of the second group of X touch routing lines are further connected to X touch link lines of a second group of X touch link lines through second contact holes in the upper non-active area, wherein the X touch link lines of the first group of X touch link lines are connected to first X touch pads of a touch sensing circuit on a same single layer, and wherein the X touch link lines of the second group of X touch link lines are connected to second X touch pads of the touch sensing circuit on a same single layer.

12. The touch display apparatus of claim 11, wherein the first group of X touch routing lines are positioned in a bezel area of the non-active area.

13. The touch display apparatus of claim 11, wherein each of the plurality of stacked layers include more than one X touch routing lines thereon.

14. The touch display apparatus of claim 11, wherein each of the plurality of stacked layers include a same number of X touch routing lines thereon.

15. The touch display apparatus of claim 11, comprising a plurality of X touch link lines on a same layer as one another.

16. The touch display apparatus of claim 15, wherein an X touch routing line of the first group of X touch routing lines is connected to an X touch link line of the plurality of X touch link lines through an interconnect structure.

17. A touch display apparatus comprising: a display panel including an active area having a plurality of subpixels, and a left bezel area, a right bezel area, and an upper non-active area outside the active area; a plurality of X touch electrode rows extending in a first direction; a plurality of Y touch electrode columns extending in a second direction intersecting the first direction, each Y touch electrode row including a plurality of Y touch electrodes connected to one another through a Y connection electrode; a plurality of Y touch routing lines, each Y touch electrode row connected to a first Y touch routing line and a second Y touch routing line, the first Y touch routing line connected to a Y touch electrode proximate to the upper non-active area, and the second Y touch routing line connected to a Y touch electrode distal to the upper non-active area; wherein the X touch routing lines of the first group of X touch routing lines are further connected to X touch link lines of a first group of X touch link lines through first contact holes in the upper non-active area, wherein the X touch routing lines of the second group of X touch routing lines are further connected to X touch link lines of a second group of X touch link lines through second contact holes in the upper non-active area, wherein the X touch link lines of the first group of X touch link lines are connected to first X touch pads of a touch sensing circuit on a same single layer, and wherein the X touch link lines of the second group of X touch link lines are connected to second X touch pads of the touch sensing circuit on a same single layer.

18. The touch display apparatus of claim 17, wherein the second Y touch routing line extends to the upper non-active area across the active area.

19. The touch display apparatus of claim 18, wherein the second Y touch routing line is disposed on a layer different from the plurality of Y touch electrodes, extends toward the upper non-active area in a winding shape along edge portions of the plurality of Y touch electrodes, and is offset from the plurality of Y touch electrodes.

* * * * *